United States Patent
Sun et al.

(10) Patent No.: US 9,780,149 B2
(45) Date of Patent: Oct. 3, 2017

(54) ORGANIC LIGHT EMITTING DIODE DISPLAY PIXEL, DISPLAY PANEL AND DISPLAY DEVICE

(71) Applicant: BOE TECHNOLOGY GROUP CO., LTD., Beijing (CN)

(72) Inventors: Tuo Sun, Beijing (CN); Ying Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 169 days.

(21) Appl. No.: 14/436,381

(22) PCT Filed: Aug. 7, 2014

(86) PCT No.: PCT/CN2014/083915
§ 371 (c)(1),
(2) Date: Apr. 16, 2015

(87) PCT Pub. No.: WO2015/143815
PCT Pub. Date: Oct. 1, 2015

(65) Prior Publication Data
US 2016/0358982 A1    Dec. 8, 2016

(30) Foreign Application Priority Data
Mar. 25, 2014    (CN) .......................... 2014 1 0115315

(51) Int. Cl.
*H01L 27/32*    (2006.01)
*G09G 1/00*    (2006.01)

(52) U.S. Cl.
CPC ...... *H01L 27/3216* (2013.01); *H01L 27/3218* (2013.01); *G09G 1/00* (2013.01); *H01L 27/3211* (2013.01)

(58) Field of Classification Search
CPC combination set(s) only.
See application file for complete search history.

(56) References Cited

U.S. PATENT DOCUMENTS 6,366,025 B1    4/2002    Yamada
2004/0108818 A1    6/2004    Cok et al.
(Continued)

FOREIGN PATENT DOCUMENTS

CN    1774147 A    5/2006
CN    101359120 A    2/2009
(Continued)

OTHER PUBLICATIONS

Dec. 30, 2014—International Search Report and Written Opinion with Eng Tran.
(Continued)

*Primary Examiner* — Kyoung Lee
*Assistant Examiner* — Ratisha Mehta
(74) *Attorney, Agent, or Firm* — Banner & Witcoff, Ltd.

(57) ABSTRACT

An organic light emitting diode display pixel, a display panel and a display device are provided. The organic light emitting diode display pixel comprises a red light emitting device, a green light emitting device and a blue light emitting device arranged side by side and disposed oblique with respect to a border of the pixel. The red light emitting device and the green light emitting device are located on both sides of the blue light emitting device, which has a length larger than those of the red one and the green one. The display pixel can prolong the service life of a display panel without reducing the total aperture ratio of pixels.

13 Claims, 4 Drawing Sheets

(56) References Cited

U.S. PATENT DOCUMENTS

2011/0291550 A1   12/2011  Kim et al.
2012/0049726 A1*   3/2012  Yoo .................... H01L 27/3213
                                                              313/504

FOREIGN PATENT DOCUMENTS

CN         103515540 A      1/2014
CN         103943656 A      7/2014

OTHER PUBLICATIONS

Feb. 1, 2016—(CN) Office Action—App 201410115315.0—Eng Tran.
May 23, 2016—(CN)—Second Office Action Appn 201410115315.0 with English Tran.

* cited by examiner

ORGANIC LIGHT EMITTING DIODE DISPLAY PIXEL, DISPLAY PANEL AND DISPLAY DEVICE

The application is a U.S. National Phase Entry of International Application No. PCT/CN2014/083915 filed on Aug. 7, 2014, designating the United States of America and claiming priority to Chinese Patent Application No. 201410115315.0 filed on Mar. 25, 2014. The present application claims priority to and the benefit of the above-identified applications and the above-identified applications are incorporated by reference herein in their entirety.

TECHNICAL FIELD

Embodiments of the present invention relate to an organic light emitting diode display pixel, a display panel and a display device.

BACKGROUND

Organic Light Emitting Diode (OLED) display screens have become the display technology of the next generation having promising future due to their advantages, such as thinness, lightness, wide visual angle, active light-emitting, continuously tunable luminous colors, low costs, fast response, low energy consumption, low driving voltages, wide range of operation temperatures, simple fabricating process, high luminous efficiency, flexible display etc.

The basic structure of an OLED comprises an anode and a cathode with an organic light emitting layer disposed therebetween. The organic light emitting layer is driven by an applied electric field and gives rise to a luminescence phenomenon through injection and recombination of carriers from the anode and the cathode respectively. Specifically, electrons and holes, as carriers, are injected from the cathode and anode respectively, migrate to the organic light emitting layer under the action of the electric field, and recombine there resulting in excitors, which release energy with their attenuation, the released energy exciting the luminous molecules to emit visible light through radiative relaxation of the excited luminous molecules.

OLEDs are classified into passive matrix OLEDs (PMOLEDs) and active matrix OLEDs (AMOLEDs) according to the driving modes. With respect to a PMOLED, cathodes and anodes are arranged in a matrix, and pixels in an array are lit in a sweeping manner with each pixel operating in a short pulse mode. A PMOLED has a simple structure to illuminate instantaneously with a high brightness, which can reduce manufacturing costs effectively, but PMOLED requires a relatively higher driving voltage and thus is not applicable to a large-sized display panel with a high resolution. With respect to an AMOLED, each pixel is controlled by an individual thin film transistor (TFT) and driven to illuminate individually and continuously. An AMOLED requires a relatively low driving voltage, has a relatively long service life, and thus is applicable to a large-sized flat panel display, however its fabricating process is relatively complex and its costs are relatively high.

SUMMARY

At least one embodiment of the present invention provides an organic light emitting diode display pixel, a display panel and a display device so as to prolong the service life of the display panel without reducing the total aperture ratio of the pixel.

At least one embodiment of the present invention provides an organic light emitting diode display pixel comprising a red light emitting device, a green light emitting device and a blue light emitting device arranged side by side and disposed oblique with respect to a border of the pixel, wherein the red light emitting device and the green light emitting device are located on both sides of the blue light emitting device, and the length of the blue light emitting device is larger than those of the red light emitting device and the green light emitting device.

At least one embodiment of the present invention provides an organic light emitting diode display panel, which comprises a plurality of display pixels described above with the pixels being arranged in an array, and the service life of the whole display panel is prolonged owing to the decrease of the degradation rate of the blue light emitting device.

At least one embodiment of the present invention further provides an organic light emitting diode display device, and its service life is also prolonged for the longer service life of the display panel.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

MAIN REFERENCE NUMERALS

100—pixel; 10—red light emitting device; 20—green light emitting device; 30—blue light emitting device.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the embodiments to be described are only some, not all, of the embodiments of the present invention. Based on the described embodiments herein, those skilled in the art can obtain other embodiment(s), without any inventive work, which should be within the scope of the invention.

Figure 1:
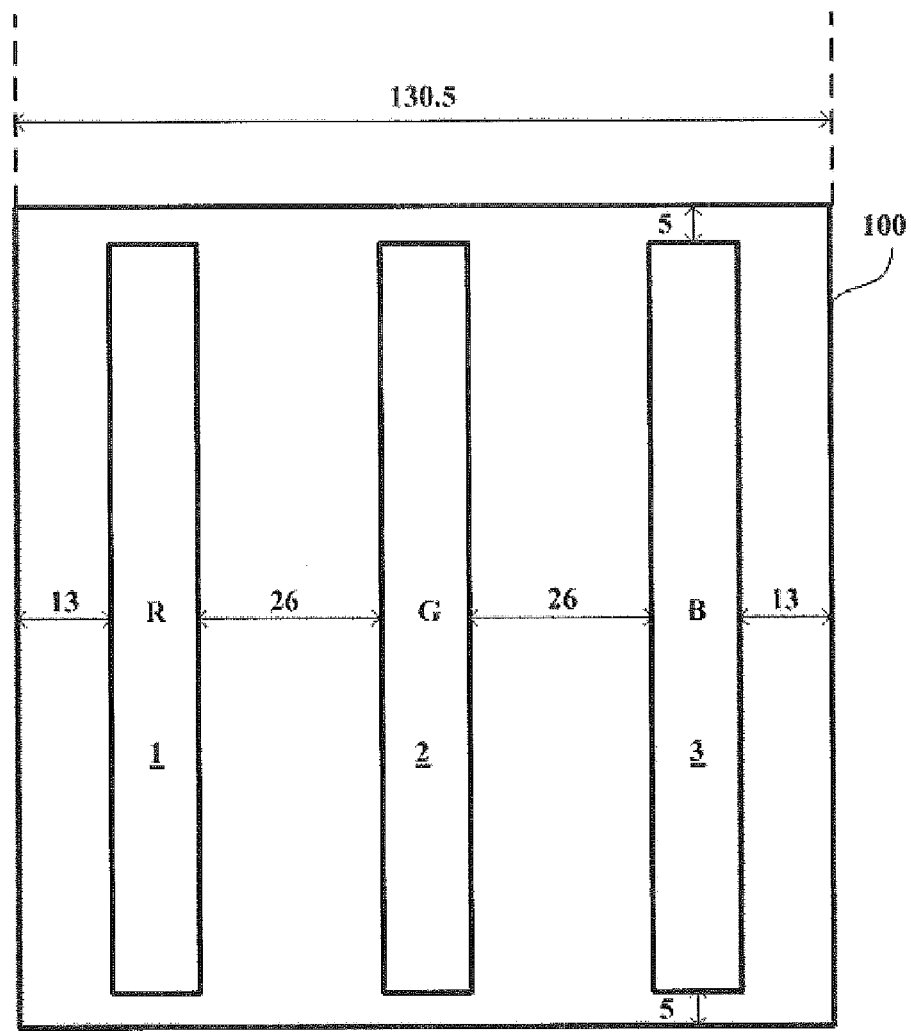
FIG. 1 is a structure diagram of an OLED display pixel.

An AMOLED display panel comprises a plurality of pixels arranged in an array. As shown in FIG. 1, each pixel 100 comprises a red light emitting device 1 (corresponding to a red sub-pixel), a green light emitting device 2 (corresponding to a green sub-pixel) and a blue light emitting device 3 (corresponding to a blue sub-pixel) with the same size and arranged side by side, the red, green, and blue light emitting devices 1, 2, 3 having an opening area ratio of 1:1:1.

The AMOLED display panel as shown in FIG. 1 has the defect that the degradation rates of the red, green, and blue light emitting devices 1, 2, 3 are not exactly the same, and among those devices the blue light emitting device 3 has the highest degradation rate and the shortest service life, which has a strong impact on the service life of the display panel so that significant color casts may occur in the display panel along with service time. If the aperture ratio of the red, green, and blue light emitting devices 1, 2, 3 is regulated, the total aperture ratio of the pixel will be reduced.

In order to prolong the service life of the display panel without reducing the total aperture ratio of the pixel, at least one embodiment of the present invention provides an organic light emitting diode (OLED) display pixel, a display panel and a display device.

In an embodiment of the present invention, the red, green and blue light emitting devices are disposed oblique with respect to a border of the pixel, and the blue one is between the red one and the green one and is the longest. In this pixel structure, if the light emitting devices of various colors have the same width, the blue light emitting device will have an opening area larger than those of the red one and the green one, and have a relatively low current density, so that the degradation rate of the blue light emitting device is reduced and the service life of the display panel is prolonged without reducing the total aperture ratio of the pixel.

Figure 2:
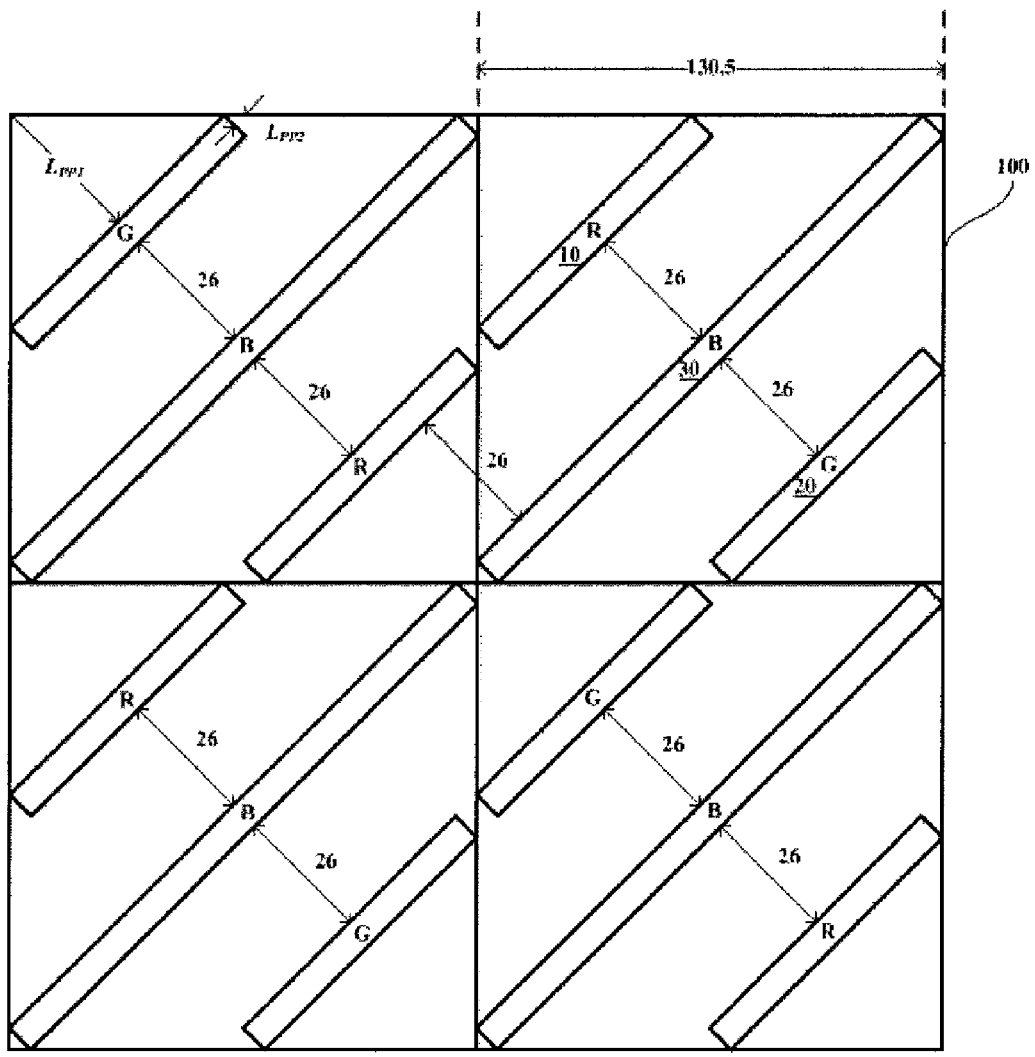
FIG. 2 is a schematic top view of the structure of an OLED display pixel in a first embodiment of the present invention.

As shown in FIG. 2, the OLED display pixel 100 provided in the first embodiment of the present invention comprises a red light emitting device 10, a green light emitting device 20 and a blue light emitting device 30 arranged in parallel and disposed oblique with respect to a border of the pixel 100. The red light emitting device 10 and the green light emitting device 20 are located on both sides of the blue light emitting device 30, which has a length larger than those of the red one 10 and the green one 20. The borders of the pixel 100 are parallel with sides of the display panel with this pixel.

Figure 3:
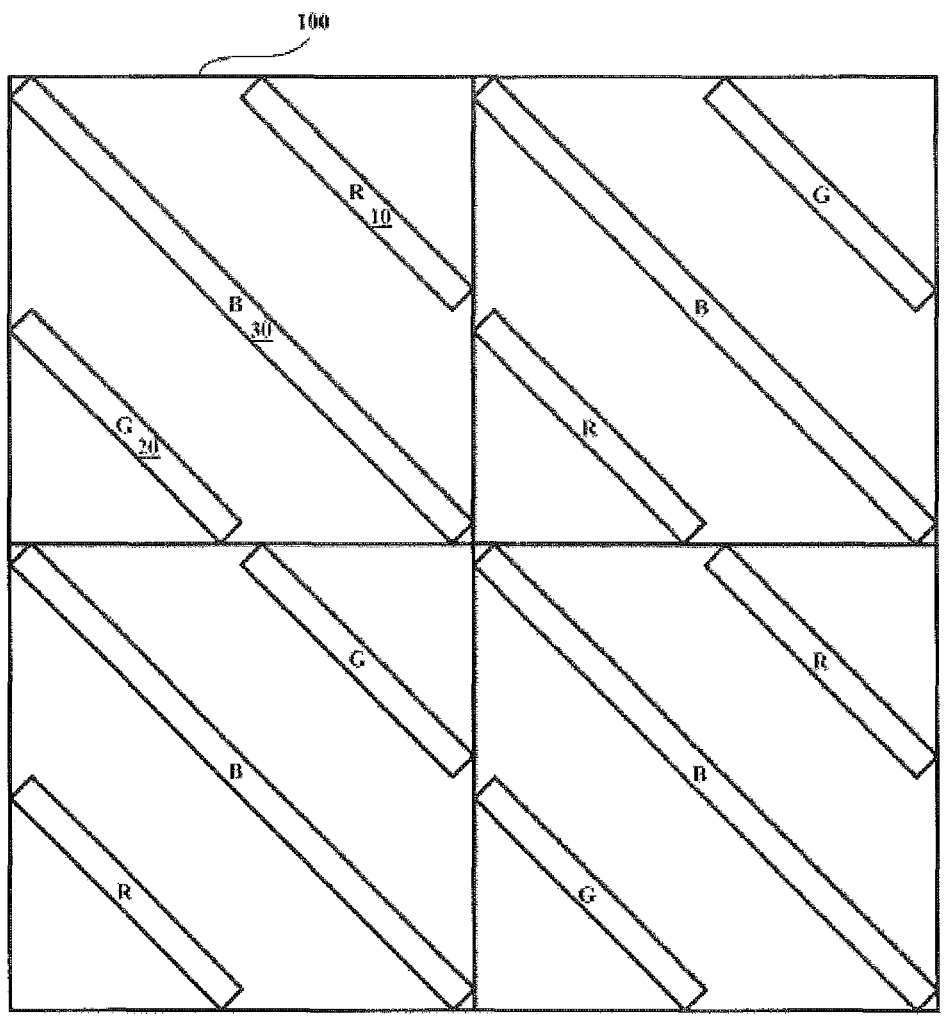
FIG. 3 is a schematic top view of the structure of an OLED display pixel in a second embodiment of the present invention.
Figure 4:
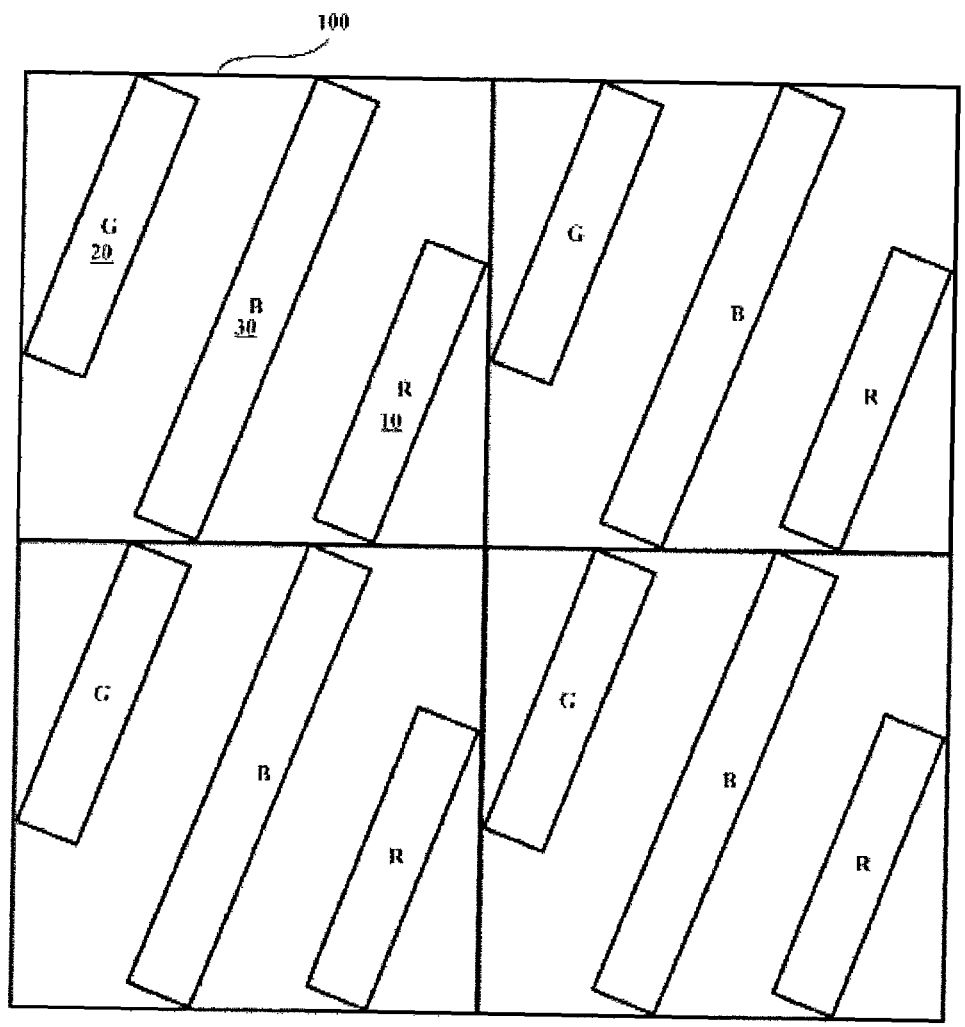
FIG. 4 is a schematic top view of the structure of an OLED display pixel in a third embodiment of the present invention.

The red, green and blue light emitting devices 10, 20, 30 have the same width and may have their lengths specifically designed according to the aperture ratio to be achieved. The oblique angles formed by the red, green and blue light emitting devices 10, 20, 30 with respect to the borders of the pixel 100 are angles not limited, such as 45, 60 degree or the like. The pixel structures shown in FIG. 2 and FIG. 3 are in a mirror symmetry. In the embodiment shown in FIG. 2 and FIG. 3, the angles formed by the red, green and blue devices 10, 20, 30 with respect to the horizontal border of the pixel 100 are all 45 degree. In the embodiment as shown in FIG. 4, the angles formed by the red, green and blue light emitting devices 10, 20, 30 with respect to the horizontal border of the pixel 100 are all 60 degree.

In at least one embodiment of the present invention, the lengths of the red, green and blue light emitting devices 10, 20, 30 satisfy the following relational expression:

$$|L_R + L_G - L_B| < \lambda$$

where $L_R$ is the length of the red light emitting device 10, $L_G$ is the length of the green one 20, $L_B$ is the length of the blue one 30, and $\lambda$ is a preset error value.

The value of $\lambda$ can be determined according to structural dimensions in combination with experiences in industry. If the sum of the lengths of the red and green light emitting devices 10, 20 is equal to or approximates the length of the blue one 30, this pixel structure can increase the opening area ratio of the blue light emitting device 30 to the red one 10 and the green one 20, reduce the current density of the blue light emitting device 30 and slow its degradation more significantly.

As shown in FIG. 2, the red and green light emitting devices 10, 20 are of the same length and distributed symmetrically on sides of the blue one 30. This design can simplify the process of coating by vaporization for the light emitting device and can realize a better display effect for the display panel. Furthermore, the pixel 100 has a square shape, the blue light emitting device 30 is located on a diagonal line of the square, and the red, green and blue light emitting devices 10, 20, 30 have their both ends extend to the borders of the pixel 100. This design can increase the opening areas of the red, green and blue light emitting devices 10, 20, 30 to a broader extent so as to increase the total aperture ratio, improve the display quality of the display panel and lower the energy consumption. With respect to two adjacent pixels 100, one pixel has the structure of the other after being transformed centro-symmetrically (the red light emitting device 10 in the first pixel is in the same position of the pixel structure as the green light emitting device 20 in the second pixel, and the green light emitting device 20 in the first pixel is in the same position of the pixel structure as the red light emitting device 10 in the second pixel, i.e., the second pixel has the structure of the first pixel after being transformed centro-symmetrically by 180°), and two red light emitting devices 10 or two green light emitting devices 20 between two blue ones 30 are in the direction of the same oblique line. In this way, among a plurality of pixels arranged in an array, the light emitting devices arranged in the direction of the same oblique line are of the same color, which can further simplify the process of coating by vaporization for the light emitting device and reduce facility costs.

In at least one embodiment of the present invention, the red, green and blue light emitting devices 10, 20, 30 are disposed oblique with respect to a border of the pixel 100, and the blue one 30 is between the red one 10 and the green one 20 and is the longest. In this pixel structure, if the light emitting devices of various colors have the same width, the blue light emitting device 30 will have an opening area larger than those of the red one 10 and the green one 20, and have a relatively low current density, so that the degradation rate of the blue light emitting device 30 is reduced and the service life of the display panel is prolonged without reducing the total aperture ratio of the pixel.

Taking the embodiment as shown in FIG. 2 as an example, the angles formed by the red, green and blue light emitting devices 10, 20, 30 with respect to the horizontal border of the pixel 100 are all 45 degree, the light emitting devices of various colors are set to have the same width, the side length of the pixel 100 is 130.5 μm, and the lateral spacing between adjacent light emitting devices is 26 μm. Assuming that $B_{R2}$, $B_{G2}$, $B_{B2}$ are the widths of the red, green and blue light emitting devices 10, 20, 30 respectively; $L_{R2}$, $L_{G2}$, $L_{B2}$ are the lengths of the red, green and blue light emitting devices 10, 20, 30 respectively; $L_{PP1}$ and $L_{PP2}$ are as shown in the figure respectively; $Ar_R$, $Ar_G$, $Ar_B$ are the opening areas of the red, green and blue light emitting devices 10, 20, 30 respectively; $S_{RGB}$ is the total opening area; Ar is the total aperture ratio of the pixel yields:

$$B_{R2} = B_{G2} = \quad \text{(Equation 1)}$$

$$B_{B2} = \frac{1}{2} \times \left(\frac{1}{2} \times 130.5 \times \sqrt{2} - 26 \times 2\right) = 20.1318 \text{ um,}$$

$$L_{B2} = \sqrt{2} \times 130.5 - B_{B2} = \quad \text{(Equation 2)}$$

$$\sqrt{2} \times 130.5 - 20.1318 = 164.3952 \text{ um,}$$

-continued $$L_{R2} = L_{G2} = 2L_{PP1} = \quad \text{(Equation 3)}$$
$$2 \times \left(\frac{\sqrt{2}}{2} \times 130.5 - 26 - 1.5B_{R2}\right) = 72.1319 \text{ um,}$$

and $$L_{PP2} = \frac{1}{2} \times B_{R2} = \frac{1}{2} \times 20.1318 = 10.0659 \text{ um.} \quad \text{(Equation 4)}$$

The limitation of $L_{PP2} \geq 5$ um by the fabricating process for an OLED gives $$L_{R2max} = L_{G2max} = 72.1319 + (10.0659 - 5) = 77.2014 \text{ um,} \quad \text{(Equation 5)}$$

so $$Ar_B:Ar_R:Ar_G = \quad \text{(Equation 6)}$$
$$(L_{B2} \times B_{B2}):(L_{R2max} \times B_{R2}):(L_{G2max} \times B_{G2}) = 1:0.47:0.47,$$

$$S_{RGB} = B_{R2} \times (2L_{R2max} + L_{B2}) = \quad \text{(Equation 7)}$$
$$20.1318 \times (77.2014 \times 2 + 164.3952) = 6417.9776 \text{ um}^2$$

and $$Ar = \frac{6417.9776}{130.5^2} = 37.6858\%. \quad \text{(Equation 8)}$$

Since in the display pixel shown in FIG. 1 let $$Ar'_B:Ar'_R:Ar'_G = 1:1:1, \quad \text{(Equation 9)}$$

thus, $$S'_{RGB} = (130.5 - 26 \times 3) \times (130.5 - 5 \times 2) = 6326.25 \text{ um}^2 \quad \text{(Equation 10)}$$

and $$Ar' = \frac{6326.25}{130.5^2} = 37.1471\%. \quad \text{(Equation 11)}$$

By comparing Equation (6) and Equation (9), it can be seen that the opening area ratio of the blue light emitting device 30 to the red light emitting device 10 and the green light emitting device 20 in the pixel structure shown in FIG. 2 is obviously larger than that in the pixel structure shown in FIG. 1. Moreover, by comparing Equation (8) and Equation (11), it can be seen that the total aperture ratio of the pixel with the pixel structure shown in FIG. 2 is not reduced, but increased relatively to the pixel structure shown in FIG. 1. Therefore, in contrast to the pixel structure shown in FIG. 1, embodiments of the present invention can slow the degradation of the blue light emitting device and prolong the service life of the display panel without reducing the total aperture ratio of the pixel.

At least one embodiment of the present invention provides an organic light emitting diode display panel, which comprises a plurality of display pixels according to any of the technical solutions described above with the pixels being arranged in an array, and the service life of the whole display panel is prolonged owing to the decrease of the degradation rate of the blue light emitting device. The OLED display panel is not limited in type. For example, it can be a PMOLED display panel or an AMOLED display panel.

At least one embodiment of the present invention further provides an organic light emitting diode display device, and its service life is also prolonged for the longer service life of the display panel. The display device can be any devices, for example, but not limited to an OLED display, an OLED TV set etc.

What are described above is related to the illustrative embodiments of the disclosure only and not limitative to the scope of the disclosure; the scopes of the disclosure are defined by the accompanying claims.

The present application claims priority of China patent application No. 201410115315.0 filed on Mar. 25, 2014, which is incorporated herein in its entirety by reference as a part of the present application.

The invention claimed is:

1. An organic light emitting diode display pixel, comprising a red light emitting device, a green light emitting device, and a blue light emitting device arranged side by side and disposed oblique with respect to a border of the pixel,
wherein the red light emitting device and the green light emitting device are located on both sides of the blue light emitting device, and a length of the blue light emitting device is larger than a length of the red light emitting device and a length of the green light emitting device.

2. The organic light emitting diode display pixel of claim 1, wherein the lengths of the red, green and blue light emitting devices satisfy the following relational expression:

$$|L_R + L_G - L_B| < \lambda,$$

where $L_R$ is the length of the red light emitting device, $L_G$ is the length of the green light emitting device, $L_B$ is the length of the blue light emitting device, and $\lambda$ is a preset error value.

3. The organic light emitting diode display pixel of claim 1, wherein the red and green light emitting devices are of a same length and distributed symmetrically on both sides of the blue light emitting device.

4. The organic light emitting diode display pixel of claim 1, wherein the pixel has a square shape, the blue light emitting device is located on a diagonal line of the square, and the red, green and blue light emitting devices have their both ends extend to the borders of the pixel.

5. The organic light emitting diode display pixel of claim 4, wherein one of two adjacent pixels has a structure of the other after being transformed centro-symmetrically, and two red light emitting devices or two green light emitting devices between two blue light emitting devices are in a direction of the same oblique line.

6. An organic light emitting diode display panel, comprising a plurality of pixels according to claim 1 with the plurality of pixels arranged in an array.

7. An organic light emitting diode display device, comprising the organic light emitting diode display panel according to claim 6.

8. The organic light emitting diode display pixel of claim 2, wherein the red and green light emitting devices are of a same length and distributed symmetrically on both sides of the blue light emitting device.

9. The organic light emitting diode display pixel of claim 2, wherein the pixel has a square shape, the blue light emitting device is located on a diagonal line of the square, and the red, green and blue light emitting devices have both their ends extend to the borders of the pixel.

10. The organic light emitting diode display pixel of claim 9, wherein one of two adjacent pixels has a structure of the other after being transformed centro-symmetrically, and two red light emitting devices or two green light emitting devices between two blue light emitting devices are in a direction of the same oblique line.

11. The organic light emitting diode display pixel of claim 3, wherein the pixel has a square shape, the blue light emitting device is located on a diagonal line of the square, and the red, green and blue light emitting devices have their both ends extend to the borders of the pixel.

12. The organic light emitting diode display pixel of claim 11, wherein one of two adjacent pixels has a structure of the other after being transformed centro-symmetrically, and two red light emitting devices or two green light emitting devices between two blue light emitting devices are in a direction of the same oblique line.

13. The organic light emitting diode display pixel of claim 1, wherein the red light emitting device, the green light emitting device and the blue light emitting device are arranged in parallel with each other.

* * * * *